(12) United States Patent
Oh

(10) Patent No.: US 6,486,531 B2
(45) Date of Patent: Nov. 26, 2002

(54) CONTACT STRUCTURE WITH A LOWER INTERCONNECTION HAVING T-SHAPED PORTION IN CROSS SECTION AND METHOD FOR FORMING THE SAME

(75) Inventor: Jae-hee Oh, Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/834,445

(22) Filed: Apr. 12, 2001

(65) Prior Publication Data

US 2002/0153589 A1 Oct. 24, 2002

(30) Foreign Application Priority Data

Jun. 20, 2000 (KR) .............................. 00-33841

(51) Int. Cl.[7] ...................... H01L 23/52; H01L 21/4763
(52) U.S. Cl. ...................... 257/532; 257/534; 257/775; 438/387; 438/398; 438/620
(58) Field of Search ................... 257/296, 306, 257/309, 532, 775, 534; 438/253, 255, 396, 398, 620, 387

(56) References Cited

U.S. PATENT DOCUMENTS

| | | | | |
|---|---|---|---|---|
| 4,905,068 A | * | 2/1990 | Satoh et al. ................ 357/68 |
| 5,828,096 A | * | 10/1998 | Ohno et al. ................ 257/306 |
| 5,920,775 A | * | 7/1999 | Koh ........................... 438/241 |
| 6,127,260 A | * | 10/2000 | Huang ........................ 438/629 |
| 6,300,239 B1 | * | 10/2001 | Ono ........................... 438/633 |
| 2001/0041405 A1 | * | 11/2001 | Aoki ........................... 438/254 |

* cited by examiner

Primary Examiner—Olik Chaudhuri
Assistant Examiner—Stephen W. Smoot
(74) Attorney, Agent, or Firm—Marger Johnson & McCollom, P.C.

(57) ABSTRACT

A contact structure in a semiconductor device and a method of forming the same are provided. The contact structure includes a lower interconnection having a capacitor upper electrode of memory cells; an interlayer dielectric layer formed on the lower interconnection and having a contact hole that exposes a portion of the lower interconnection; and an upper interconnection formed on the interlayer dielectric layer and electrically connected to the lower interconnection through the contact hole. The lower portion of the lower interconnection has a larger width than the bottom of the contact hole and extends downward or below the bottom of the contact hole so that the lower interconnection has a T-shape in cross-section. With these structures, the lower interconnection can be prevented from being pierced when the contact holes are formed. Consequently, stable and uniform contact resistance can be obtained.

18 Claims, 6 Drawing Sheets

CONTACT STRUCTURE WITH A LOWER INTERCONNECTION HAVING T-SHAPED PORTION IN CROSS SECTION AND METHOD FOR FORMING THE SAME

BACKGROUND OF THE INVENTION

1. Field of the Invention

The present invention relates to a semiconductor device, and more particularly, to a contact structure in a semiconductor device including a dynamic random access memory (DRAM) with a capacitor, and a method of forming the same.

2. Description of the Related Art

As the integration density of semiconductor devices increases, the area of a capacitor, which is an information storage unit of a memory device, e.g. DRAM, decreases. To obtain capacitance equal to or larger than that before on the decreased area, methods for increasing the area of an effective electrode by making the electrode of the capacitor in a three-dimensional shape such as a cylinder or a pin have been used. However, as the height of an electrode of a capacitor increases, a global step difference between a cell array area in which the capacitor is formed and a peripheral circuit area or a logic circuit area for driving memory cells increases. This global step difference causes many problems during a subsequent metal wiring process. In particular, in the case of a Merged DRAM with Logic (MDL) device, the number of layers of a metal interconnection is larger as compared with a simple DRAM device, so the problem of a global step difference is more serious.

To reduce the global step difference between a cell array area and a peripheral circuit area or a logic circuit area, a method of leaving a sacrificial oxide layer used for forming a lower electrode without removing it from the peripheral circuit area or the logic circuit area may be used. This method will be described with reference to FIG. 1. A reference character A in FIG. 1 denotes a cell array area in a DRAM, and a reference character B denotes a peripheral circuit area or a logic circuit area.

Referring to FIG. 1, a capacitor composed of a lower electrode 40, a dielectric layer 50 and an upper electrode 60 is formed in a cell array area A of the DRAM. An interlayer dielectric layer 10 is interposed between the lower electrode 40 and a substrate (not shown) including a transistor (not shown). The lower electrode 40 is connected to an active region of the substrate through a lower electrode contact plug 20. Metal contacts 90, 92 and 94 connected to the upper electrode 60, a predetermined active region of the substrate and a circuit device 62 such as a load resistance, respectively, are formed in a peripheral circuit area or a logic circuit area B. Here, the lower electrode 40 is formed to be as high as possible in a cylinder shape to increase an effective area thereof. The outer surface of the cylinder-shape lower electrode 40 is surrounded by a sacrificial oxide layer, that is, a mold insulation layer 30, and is not used as an effective electrode. When even the outer surface of the lower electrode 40 is used as an electrode after the mold insulation layer 30 is removed, global step difference as much as the height of the lower electrode 40 occurs between the cell array area A and the peripheral circuit area or the logic circuit area B.

As a result of leaving the mold insulation layer 30, when interlayer dielectric layers 70, 30 and 10 are etched to form contact holes 80, 82 and 84 for the metal contacts 90, 92 and 94 in the peripheral circuit area or the logic circuit area B, the difference between the depth of a deep contact hole, for example, the contact hole 82 for the metal contact 92 connected to the active region of the substrate, and the depth of each of the contact holes 80 and 84 for the upper electrode contact 90 and the circuit device contact 94, respectively, is very large. Accordingly, when the contact holes 80 and 84 exposing the upper electrode 60 and the circuit device 62, respectively, which are formed of conductive material such as doped polysilicon, are formed, etching may not be stopped at the upper electrode 60 and the circuit device 62 but may proceed to penetrate the upper electrode 60 and the circuit device 62. When the contact holes 80 and 84 penetrate the upper electrode 60 and the circuit device 62, and thus the metal contacts 90 and 94 are formed even in the underlying mold insulation layer 30, contact resistance increases, and the distribution of resistance values is large. In other words, the resistance values are non-uniform. In the worst case, the metal contacts 90 and 94 may be short-circuited with other interconnections passing therebelow.

SUMMARY OF THE INVENTION

To solve the above problems, it is a first object of the present invention to provide a contact structure that realizes a satisfactory contact profile in a peripheral circuit area or a logic circuit area and does not penetrate an underlying interconnection in a semiconductor device including a dynamic random access memory (DRAM).

It is a second object of the present invention to provide a method of forming the above contact structure.

Accordingly, to achieve the first object of the invention, there is provided a contact structure formed in a peripheral circuit area or a logic circuit area of a semiconductor device including a DRAM having a cell array area with a plurality of DRAM cells and the peripheral or logic circuit area. The contact structure includes a lower interconnection formed of the same material as a capacitor upper electrode of each of the plurality of DRAM cells, an interlayer dielectric layer formed on the lower interconnection and having a contact hole exposing a predetermined region of the lower interconnection, and an upper interconnection formed on the interlayer dielectric layer, filling the contact hole and electrically connected to the lower interconnection. The lower portion of the lower interconnection has a larger area than the bottom of the contact hole and extends downward so that the lower interconnection has a T-shape in a cross-sectional view.

To achieve the second object of the invention, in one aspect, there is provided a method of forming a contact structure in a peripheral circuit area or a logic circuit area of a semiconductor device including a DRAM having a cell array area with a plurality of DRAM cells and the peripheral or logic circuit area. First, capacitor upper electrode of each DRAM cell is formed, and concurrently, a lower interconnection of the same material as the capacitor upper electrode is formed to have a T-shape in cross section on a predetermined portion of the peripheral circuit area or the logic circuit area. Next, an interlayer dielectric layer is formed on the lower interconnection to have a contact hole exposing a predetermined portion of the lower interconnection. An upper interconnection is formed on the interlayer dielectric layer to fill the contact hole and be electrically connected to the lower interconnection. Therefore, the contact structure is completed.

In another aspect, there is provided a method of forming a plurality of contact structures having contact holes of different depths in a peripheral circuit area or a logic circuit area of a semiconductor device including a DRAM having a cell array area with a plurality of DRAM cells and the peripheral or logic circuit area. Firstly, a mold insulation layer is formed on the surface of a substrate including a capacitor lower electrode contact plug of each DRAM cell. The mold insulation layer is patterned, thereby forming a lower electrode opening exposing the capacitor lower electrode contact plug and a lower interconnection opening where a contact structure having a relatively shallow contact hole among the plurality of contact structures will be formed. Subsequently, a lower electrode layer is formed by depositing a conductive material on the entire surface of the mold insulation layer and the openings. A cylinder-shape capacitor lower electrode is formed within the lower electrode opening, and simultaneously, a cylinder-shape dummy lower electrode pattern is formed within the lower interconnection opening, by removing the lower electrode layer deposited on the mold insulation layer. Next, a dielectric layer is formed on the entire surface of the substrate including the capacitor lower electrode and the dummy lower electrode pattern. Thereafter, an upper electrode layer filling the cylinder-shape capacitor lower electrode and the cylinder-shape dummy lower electrode pattern is formed by depositing a conductive material on the entire surface of the dielectric layer to a predetermined thickness. The capacitor upper electrode of each DRAM cell and a lower interconnection having a T-shape section in the lower interconnection opening are simultaneously formed by patterning the upper electrode layer. Next, an interlayer dielectric layer is formed on the entire surfaces of the upper electrode and the lower interconnection. The interlayer dielectric layer is etched, thereby forming a shallow contact hole exposing the lower interconnection and a deep contact hole exposing a predetermined conductive layer below the lower interconnection. Finally, upper interconnections, which fill the contact holes and are electrically connected to the lower interconnection and the predetermined conductive layer, respectively, are formed on the interlayer dielectric layer.

Since a lower interconnection, which an upper interconnection or a contact plug contacts, has a T-shape extending downward, the upper interconnection or the contact plug of a relatively shallow upper electrode contact or a circuit device contact does not pierce the lower interconnection when contacts having a large difference in depth are formed in a peripheral circuit area or a logic circuit area.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Figure 1:
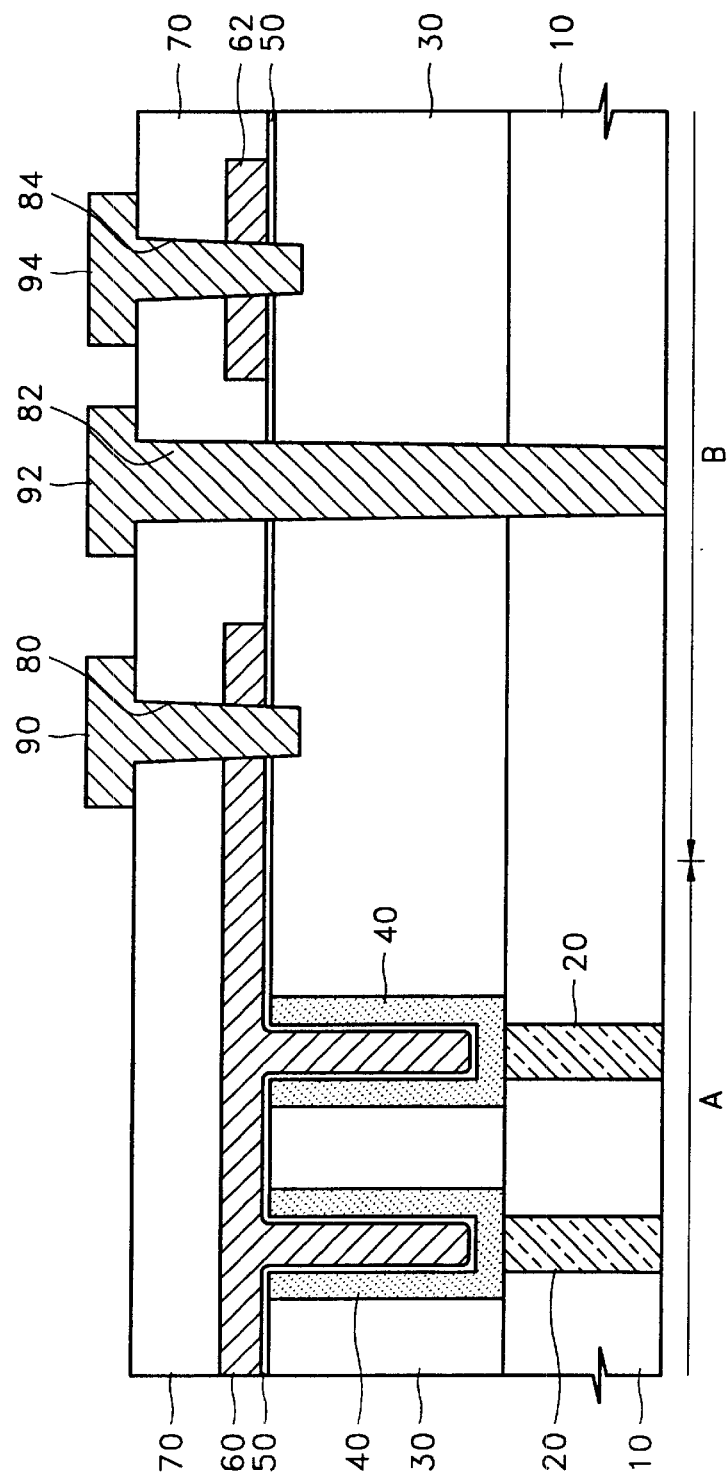
FIG. 1 is a partial, cross-sectional view illustrating a semiconductor device having a conventional contact structure.

Hereinafter, embodiments of the present invention will be described in detail with reference to the attached drawings. The present invention is not restricted to the following embodiments, and many variations are possible within the spirit and scope of the present invention. In the drawings, the shapes of some members are exaggerated for clarity and the same reference numerals denote the same members. Also, when a layer is described as being on another layer, it can be directly on the other layer or an interlayer film can exist therebetween.

Figure 2:
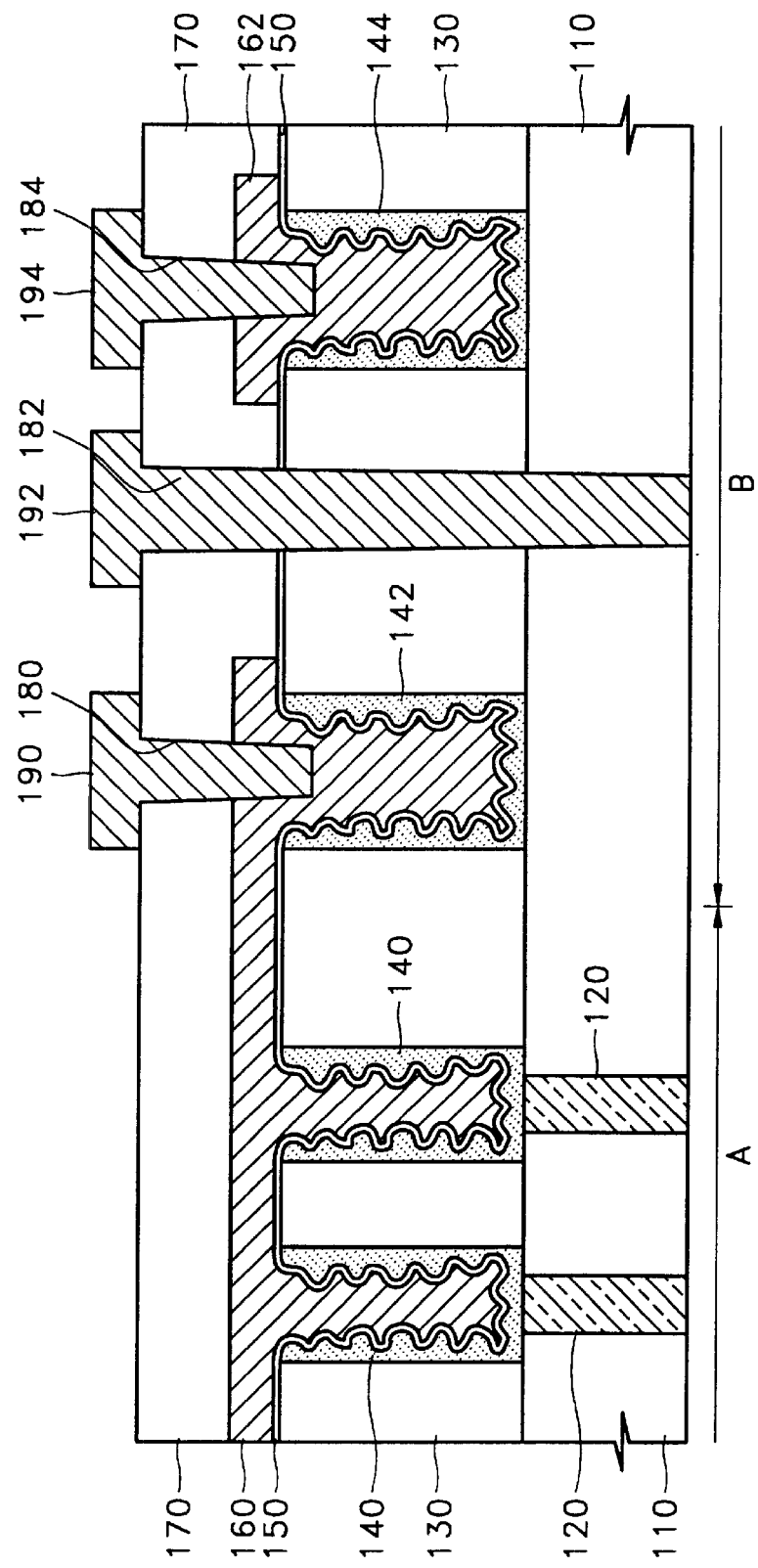
FIG. 2 is a partial, cross-sectional view illustrating a semiconductor device having a contact structure according to the present invention.

FIG. 2 is a partial, cross-sectional view of a semiconductor device including a dynamic random access memory (DRAM) having a contact structure according to an embodiment of the present invention. Referring to FIG. 2, the semiconductor device of this embodiment is composed of a cell array area A in which a plurality of DRAM cells are formed to the left in the drawing and a peripheral circuit area or a logic circuit area B including contacts to the right in the drawing.

A capacitor composed of a lower electrode 140, a dielectric layer 150 and an upper electrode 160 is formed in the cell array area A. The lower electrode 140 is electrically connected to a source region on a substrate (not shown) through a lower electrode contact plug 120. Here, the lower electrode 140 is formed in a cylinder shape, and a hemispheric grain is grown on the inner surface of the lower electrode 140. However, the hemispheric grain may not be formed depending on applications.

Several different contact structures are formed in the peripheral circuit area or the logic circuit area B. Among the contact structures, the present invention is directed to the contact structures having shallow contact holes, i.e. a contact structure 160 and 190 connecting the upper electrode 160 to an upper interconnection 190 and a contact structure 162 and 194 connecting a circuit device 162 such as a load resistance to an upper interconnection 194. Here, the load resistance is a structure in which two lower interconnections 162 are connected to each other (not shown) and to upper interconnections 194, respectively, the latter of which are electrodes, as shown in FIG. 2. In this structure, the lower interconnection 162 is connected between the two upper interconnections 194 (which are electrodes) on a mold insulation layer 130 and acts as a resistance.

As shown in FIG. 2, a contact structure according to the preferred embodiment of the present invention comprises the lower interconnection 160 or 162 and the upper interconnection 190 or 194. (The element denoted by reference numeral 160 functions as an upper electrode in a cell array area and functions as a lower interconnection in a contact structure.) The lower interconnection 160 or 162 is substantially T-shape in cross-section. The upper interconnection 190 or 194 fills a contact hole 180 or 184 in an interlayer dielectric layer 170. The upper interconnection 190 or 194 extends down to a predetermined depth from the top and at the center of the lower interconnection 160 or 162, and thus is connected to the lower interconnection 160 or 162.

Here, each of the upper interconnections 190, 192 and 194 is formed integral with contact plugs, as shown. Alternatively, each of the upper interconnections 190, 192 and 194 comprises a contact plug and an upper interconnection pattern formed on the contact plug and on the interlayer dielectric layer 170. The upper interconnection pattern is electrically connected to the contact plug. The contact plug fills the contact hole 180, 182 or 184 and is planarized to have substantially the same level as the interlayer dielectric layer 170. Although not shown, an ohmic layer and a barrier metal layer may be formed on the bottom and sidewalls of each of the contact holes 180, 182 and 184 if each of the upper interconnections 190, 192 and 194 or each contact plug is formed of metal such as tungsten.

Reference numeral 110 denotes an interlayer dielectric layer formed on the substrate. Reference numeral 130 denotes a mold insulation layer for defining the lower electrode 140 and openings for forming the lower interconnections 160 and 162. Reference numerals 142 and 144 denote dummy lower electrode patterns that will become contact structures according to one embodiment of the present invention described later.

Since each of the lower interconnections 160 and 162 has a T-shape, the lower interconnections 160 and 162 are not penetrated when the shallow lower electrode contact hole 180 and the shallow circuit device contact hole 184 are simultaneously formed while the interlayer dielectric layers 170, 130 and 110 are etched to form the deep contact hole 182 exposing an active region on the substrate.

FIGS. 3–6 illustrates a method for manufacturing a contact structure in accordance with preferred embodiment of the present invention. Details of the manufacturing steps are omitted if they are conventional or well known, for clarity and simplicity.

Figure 3:
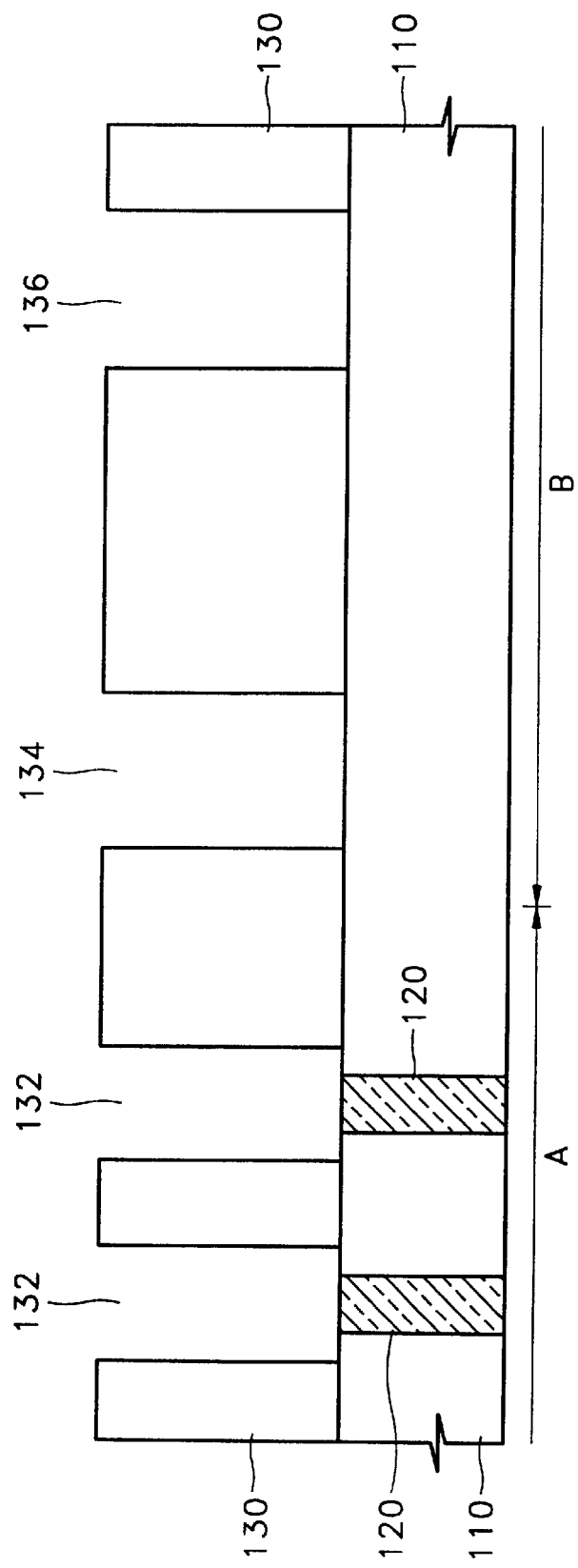
FIGS. 3 through 6 are cross-sectional views illustrating the steps of forming a contact structure according to the present invention.

Referring to FIG. 3, although not shown, a device such as a transistor including source and drain regions are formed and a cell array area A and a peripheral circuit area or a logic circuit area B are defined on a semiconductor substrate. Thereafter, an interlayer dielectric layer 110 is deposited on the resultant structure, and a contact hole exposing an active region (the source region) of the cell array area A in the substrate is formed. Next, the contact hole is filled with a conductive material, for example, impurity doped polysilicon, thereby forming a lower electrode contact plug 120.

Subsequently, a material layer such as a silicon oxide layer is deposited on the interlayer dielectric layer 110 and the lower electrode contact plug 120, thereby forming a mold insulation layer 130. The mold insulation layer 130 is etched to form a lower electrode opening 132 exposing the lower electrode contact plug 120 in the cell array area A. Preferably, lower interconnection openings 134 and 136 are concurrently formed where contacts will be formed in the peripheral circuit area or the logic circuit area B. Each of the lower interconnection openings 134 and 136 is formed to be relatively larger than the lower electrode opening 132 so that the lower interconnection openings 134 and 136 can sufficiently surround the bottoms of contact holes 180 and 184, respectively, which will be formed later.

Figure 4:
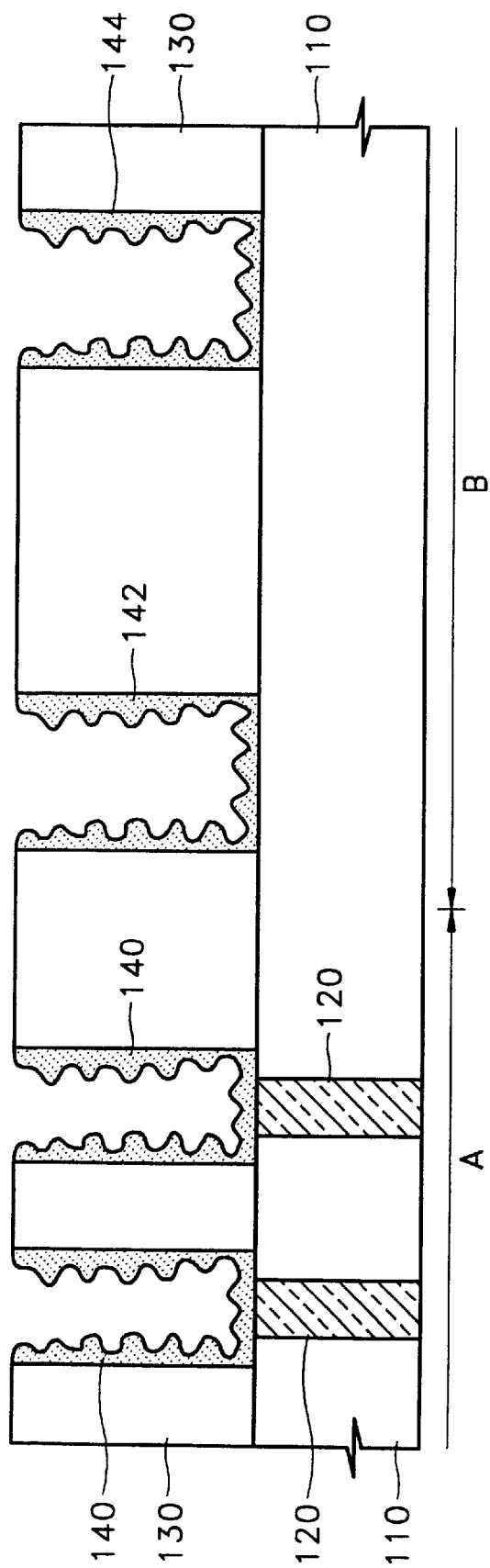

Now referring to FIG. 4, a conductive material is conformally deposited on the substrate including the mold insulation layer 130 and the openings 132, 134 and 136. Then, the conductive material deposited on the mold insulation layer 130 is removed, thereby forming a cylinder-shaped lower electrode and dummy lower electrode patterns in the lower electrode openings 132 and the lower interconnection openings 134 and 136, respectively.

More specifically, to form a lower electrode 140 and dummy lower electrode patterns 142 and 144, on the surfaces of which hemispheric grains are to be grown, amorphous silicon is conformally deposited on the resultant structure of FIG. 3. Next, a material such as photoresist having an excellent fluidity is deposited on the resultant structure, thereby filling the openings 132, 134 and 136.

Subsequently, chemical mechanical polishing (CMP) or blanket etching is performed on the substrate to expose the mold insulation layer 130, thereby forming the lower electrode 140 and the dummy lower electrode patterns 142 and 144 which are isolated from one another.

Next, the photoresist filling the openings 132, 134 and 136 is removed. A hemispheric grain is grown by performing seeding and heat treatment shortly and preferably immediately after the amorphous silicon is deposited or, alternatively, after the photoresist is removed.

Figure 5:
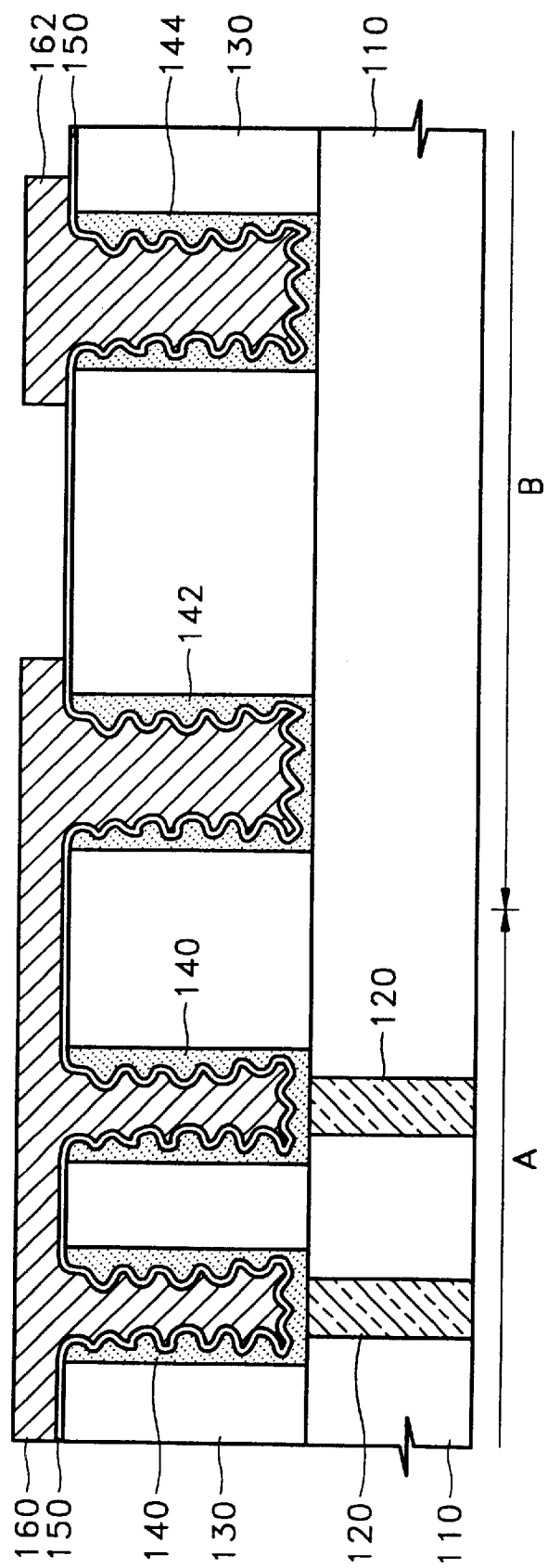

Turning to FIG. 5, a dielectric layer 150 is formed on the resultant structure shown in FIG. 4. A conductive material such as impurity doped polysilicon, which will become an upper electrode in the cell array area A and which will become lower interconnections in the peripheral circuit area or the logic circuit area B, is deposited on the dielectric layer 150, thereby filling the insides of the cylinder-shape lower electrode 140 and the cylinder-shape dummy lower electrode patterns 142 and 144. Subsequently, the conductive material is patterned, thereby forming an upper electrode (a lower interconnection) 160 and lower interconnection 162. As a result, each of the lower interconnections 160 and 162 for forming contact structures in the peripheral circuit area or the logic circuit area B fills one of the cylinder-shaped dummy lower electrode patterns 142 and 144 and forms a T-shape like the structure in the cell array area A.

Figure 6:
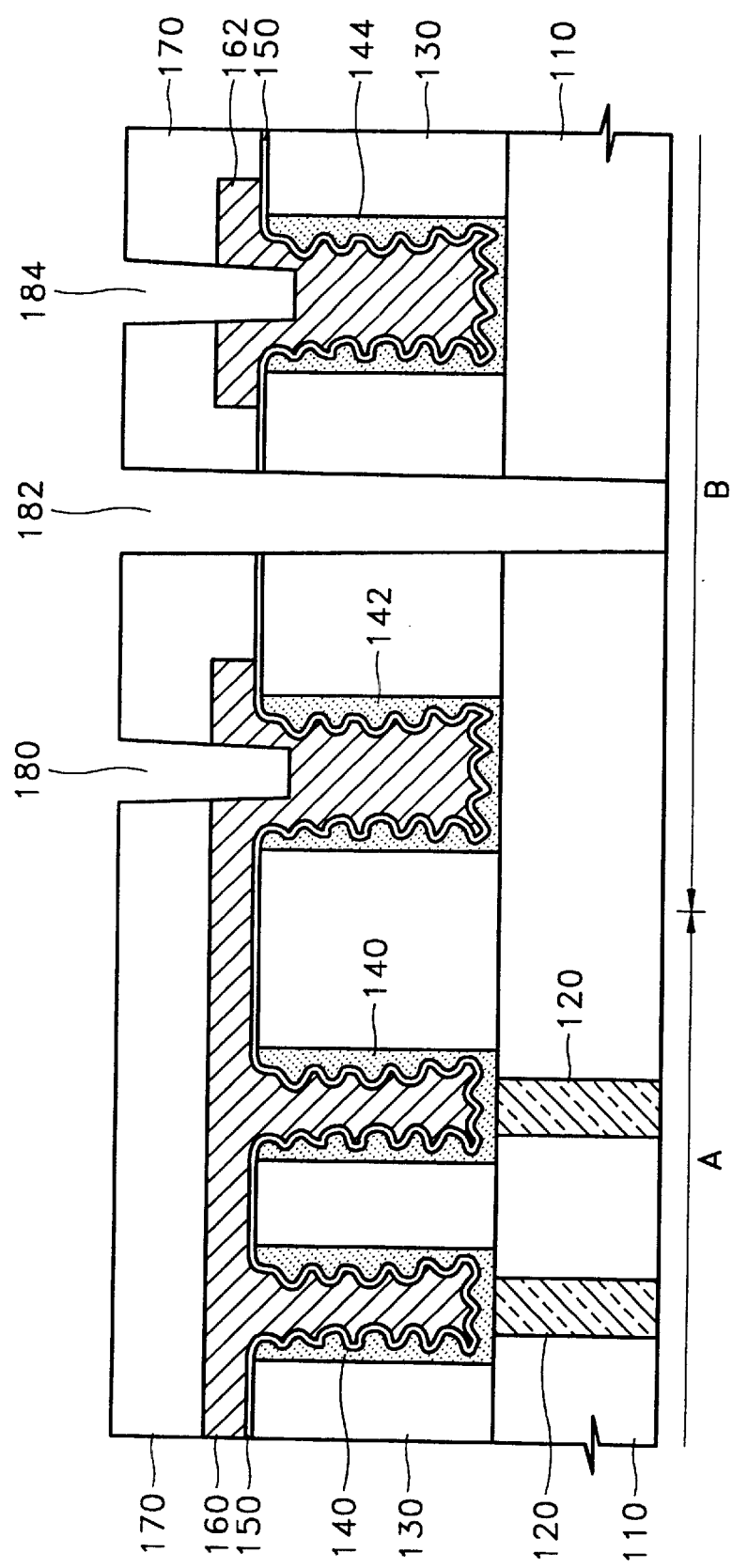

Thereafter, as shown in FIG. 6, an interlayer dielectric layer 170 is deposited on the resultant structure of FIG. 5 and etched, thereby forming contact holes 180, 182 and 184 in the peripheral circuit area or the logic circuit area B. The contact hole 182 is a deep contact hole and provides for electrical connection to an active region or a gate electrode on the substrate. The upper electrode contact hole 180 and the circuit device contact hole 184 are relatively shallower than the deep contact hole 182 and are concurrently formed with the deep contact hole 182. Although the difference between the depth of the deep contact hole 182 and the depth of the shallow contact holes 180 and 184 is large, a problem of a conventional contact structure (see FIG. 1) with a lower interconnection being penetrated does not occur. This is because the lower interconnections 160 and 162 exposed by the shallow contact holes 180 and 184 extends downward forming a T-shape such that the shallow contact holes 180 and 184 do not penetrate the lower interconnections 160 and 162.

Thereafter, a conductive material such as tungsten is deposited on the resultant structure of FIG. 6 by a typical method to fill the contact holes 180, 182 and 184. Then, planarization is performed by a method such as CMP, thereby forming contact plugs. Subsequently, a material such as aluminum or an aluminum alloy is deposited on the surface of the resultant structure by a typical method to form an upper interconnection layer. The upper interconnection layer is patterned, thereby forming upper interconnections 190, 192 and 194, as shown in FIG. 2. Although not shown, it is preferable to sequentially form an ohmic metal layer such as a titanium layer, and a barrier layer such as a titanium nitride layer, on the sidewalls of the contact holes 180, 182 and 184 before forming the contact plugs.

Although the preferred embodiments of the present invention have been fully described using specific terms and structures, they should not be construed to restrict the scope of the invention. For example, a method of forming a cell array area of a DRAM capable of employing a contact structure of the present invention can be variously modified. Although not described in the above embodiments, an etching stopper, such as a silicon nitride layer, may be interposed between the interlayer dielectric layer 110 and the mold insulation layer 130. In addition, a silicon nitride layer may be formed on the mold insulation layer 130 and used as a polishing stopper when the cylinder-shape lower electrode 140 and the cylinder-shape dummy lower electrode patterns 142 and 144 filling the lower electrode opening 132 and the lower interconnection openings 134 and 136, respectively, are formed. When the silicon nitride layer is formed on the mold insulation layer 130, when the mold insulation layer 130 is etched to form the openings 132, 134 and 136, anisotropic etching may be first performed, and then wet etching is performed so that the openings can have a large width. In addition, it will be apparent that deposition and etching of material layers can be performed by a variety of methods already known.

As described above, the present invention forms a lower interconnection exposed by a shallow contact hole to have a T-shape extending downward for forming contact holes having a large difference in depth, thereby preventing the lower interconnection from being penetrated. Consequently, stable and uniform contact resistance can be obtained. In particular, since a method of forming a contact structure according to the present invention uses conventional DRAM manufacturing processes, additional processes are not necessary.

As stated above, although the invention has been described with reference to various preferred embodiments, it will be apparent to one of ordinary skill in the art that modification of the described embodiments may be made without departing from the spirit and scope of the invention. Therefore, the scope of the invention, as defined by the following claims, should not be limited to the preferred embodiments described herein.

What is claimed is:

1. A contact structure formed in a peripheral circuit area or a logic circuit area of a semiconductor device having a cell array area with a plurality of memory cells and the peripheral or logic circuit area, the contact structure comprising:

a lower interconnection formed integral with a capacitor upper electrode of the plurality of memory cells;

an interlayer dielectric layer formed on the lower interconnection and having a contact hole exposing a region of the lower interconnection; and an upper interconnection formed on the interlayer dielectric layer, filling the contact hole and being electrically connected to the lower interconnection, wherein the lower interconnection has a substantially T-shaped portion in cross section, the T-shaped portion having a larger width than the bottom of the contact hole and extending below the bottom of the contact hole.

2. The contact structure of claim 1, wherein the T-shaped portion overlies another interlayer dielectric layer.

3. The contact structure of claim 1, wherein the upper interconnections are connected by another lower interconnection.

4. The contact structure of claim 3, wherein the another lower interconnection has-a T-shaped portion in cross section to have a larger width than the bottom of a contact hole and extending below the bottom of the contact hole.

5. A contact structure formed in a peripheral circuit area or a logic circuit area of a semiconductor device having a cell array area with a plurality of memory cells and the peripheral or logic circuit area, the contact structure comprising:

a lower interconnection formed of the same material as a capacitor upper electrode of the plurality of memory cells;

an interlayer dielectric layer formed on the lower interconnection and having a contact hole exposing a region of the lower interconnection; and an upper interconnection formed on the interlayer dielectric layer, filling the contact hole and being electrically connected to the lower interconnection, wherein the lower interconnection has a T-shaped portion in cross section, the T-shaped portion having a larger width than the bottom of the contact hole and extending below the bottom of the contact hole, and wherein the T-shaped portion overlies another interlayer dielectric layer.

6. A contact structure formed in a peripheral circuit area or a logic circuit area of a semiconductor device including a dynamic random access memory (DRAM) having a cell array area with a plurality of DRAM cells and the peripheral or logic circuit area, the contact structure comprising:

a lower interconnection including a capacitor upper electrode of the plurality of DRAM cells;

an interlayer dielectric layer formed on the lower interconnection and having a contact hole exposing a region of the lower interconnection; and an upper interconnection formed on the interlayer dielectric layer, filling the contact hole and being electrically connected to the lower interconnection, wherein the lower interconnection has a substantially T-shaped portion in cross section, thee T-shaped portion having a larger width than the bottom of the contact hole and extending below the bottom of the contact hole.

7. The contact structure of claim 6, wherein the T-shaped portion overlies another interlayer dielectric layer.

8. The contact structure of claim 6, wherein the T-shaped portion includes a leg part and a cross part, further comprising a dielectric layer and a conductive layer pattern under the lower interconnection, the dielectric layer and the conductive layer pattern being formed of the same materials as a capacitor dielectric of each DRAM cell and a capacitor lower electrode, respectively, and surrounding the leg part of the T-shaped lower interconnection.

9. The contact structure of claim 6, wherein the upper interconnection comprises a contact plug filling the contact hole and an upper interconnection pattern formed on the contact plug.

10. The contact structure of claim 6, wherein the T-shaped portion includes a leg part and a cross part, wherein the upper interconnection filling the contact hole extends into the leg part of the T-shaped lower interconnection to a predetermined depth.

11. The contact structure of claim 6, wherein the lower interconnection is connected to the capacitor upper electrode so that the contact structure connects the upper electrode to the overlying upper interconnection.

12. The contact structure of claim 6, wherein the lower interconnection forms a load resistance isolated from the capacitor upper electrode so that the contact structure connects the load resistance to the overlying upper interconnection.

13. A method of forming a contact structure in a peripheral circuit area or a logic circuit area of a semiconductor device including a dynamic random access memory (DRAM) having a cell array area with a plurality of DRAM cells and the peripheral or logic circuit area, the method comprising:

forming a capacitor upper electrode of each DRAM cell and concurrently forming a lower interconnection of the same material as the capacitor upper electrode to have a T-shape in cross section on a predetermined portion of the peripheral circuit area or the logic circuit area;

forming an interlayer dielectric layer on the lower interconnection, the interlayer dielectric layer having a contact hole exposing a region of the lower interconnection; and forming an upper interconnection on the interlayer dielectric layer, the upper interconnection filling the contact hole and electrically connected to the lower interconnection.

14. The method of claim 13, before forming the lower interconnection, further comprising:

forming a mold insulation layer on a substrate having a capacitor lower electrode contact plug of each DRAM cell, the mold insulation layer having a lower electrode opening exposing the capacitor lower electrode contact plug and a lower interconnection opening where the contact structure is to be formed;

forming a lower electrode layer by depositing a conductive material on the surface of the mold insulation layer and the openings;

concurrently forming a cylinder-shaped capacitor lower electrode within the lower electrode opening and a cylinder-shaped dummy lower electrode pattern within the lower interconnection opening by removing the lower electrode layer deposited on the mold insulation layer; and forming a dielectric layer on the substrate including the capacitor lower electrode and the dummy lower electrode pattern.

15. The method of claim 14, wherein the step of forming the lower interconnection comprises:

forming an upper electrode layer, filling the cylinder-shaped capacitor lower electrode and the cylinder-shaped dummy lower electrode pattern by depositing a conductive material on the surface of the dielectric layer; and concurrently forming the capacitor upper electrode and the lower interconnection having a T-shape in cross section where the contact structure is to be formed by patterning the upper electrode layer.

16. The method of claim 14, wherein the step of forming the lower electrode layer comprises growing a hemispheric grain on the surface of the lower electrode layer.

17. The method of claim 13, wherein the step of forming the upper interconnection comprises:

filling the contact hole by depositing a conductive material on the surface of the interlayer dielectric layer including the contact hole;

forming a contact plug by removing the conductive material deposited on the interlayer dielectric layer; and forming the upper interconnection by depositing and patterning a conductive material on the contact plug and the interlayer dielectric layer.

18. A method of forming a plurality of contact structures having contact holes of different depths in a peripheral circuit area or a logic circuit area of a semiconductor device including a dynamic random access memory (DRAM) having a cell array area with a plurality of DRAM cells and the peripheral or logic circuit area, the method comprising:

forming a mold insulation layer on a substrate including a capacitor lower electrode contact plug of each DRAM cell;

patterning the mold insulation layer, thereby forming a lower electrode opening exposing the capacitor lower electrode contact plug and a lower interconnection opening where a contact structure having a shallow contact hole among the plurality of contact structures is to be formed;

forming a lower electrode layer by depositing a conductive material on a surface of the mold insulation layer and the openings;

concurrently forming a cylinder-shaped capacitor lower electrode within the lower electrode opening and a cylinder-shaped dummy lower electrode pattern within the lower interconnection opening by removing the lower electrode layer deposited on the mold insulation layer;

forming a dielectric layer on the surface of the substrate including the capacitor lower electrode and the dummy lower electrode pattern;

forming an upper electrode layer filling the cylinder-shaped capacitor lower electrode and the cylinder-shaped dummy lower electrode pattern by depositing a conductive material on the surface of the dielectric layer to a predetermined thickness;

concurrently forming the capacitor upper electrode of each DRAM cell and a lower interconnection having a T-shape in cross section in the lower interconnection opening by patterning the upper electrode layer;

forming an interlayer dielectric layer on the surfaces of the upper electrode and the lower interconnection;

forming a relatively shallow contact hole exposing the lower interconnection and a relatively deep contact hole exposing a predetermined conductive layer below the lower interconnection by etching the interlayer dielectric layer; and forming upper interconnections on the interlayer dielectric layer, the upper interconnections filling the contact holes and being electrically connected to the lower interconnection and the predetermined conductive layer.

* * * * *